United States Patent [19]

Hicks

[11] 4,419,608

[45] Dec. 6, 1983

[54] HORIZONTAL DEFLECTION CIRCUIT

[75] Inventor: James E. Hicks, New Palestine, Ind.

[73] Assignee: RCA Corporation, New York, N.Y.

[21] Appl. No.: 330,385

[22] Filed: Dec. 14, 1981

[51] Int. Cl.³ .......................... H01J 29/70; H01J 29/76
[52] U.S. Cl. .................................................... 315/408
[58] Field of Search ................................ 315/399, 408

[56] References Cited

U.S. PATENT DOCUMENTS

| | | | |
|---|---|---|---|
| 3,970,894 | 7/1976 | Yasuda et al. ...................... | 315/370 |
| 4,147,964 | 4/1979 | Luz et al. .............................. | 315/411 |
| 4,254,365 | 3/1981 | Knight ................................. | 315/371 |

OTHER PUBLICATIONS

Chirlian, *Analysis and Design of Integrated Electronic Circuits*, 1981, Harper & Row, N.Y. p. 715.

Millman et al., *Integrated Electronics: Analog & Digital Circuits & Systems*, 1972, McGraw-Hill, N.Y., p. 434.

*Primary Examiner*—Theodore M. Blum
*Attorney, Agent, or Firm*—Paul J. Rasmussen; William H. Meise; Scott J. Stevens

[57] ABSTRACT

A horizontal deflection circuit for a television receiver includes a switching output transistor which may experience high collector current under certain receiver conditions. A resistor is placed in the transistor emitter path to provide negative feedback to the base drive circuit in order to control transistor conduction. The horizontal deflection yoke is returned to the emitter of the output transistor so that yoke current will not flow through the resistor, which would otherwise degrade deflection linearity.

6 Claims, 1 Drawing Figure

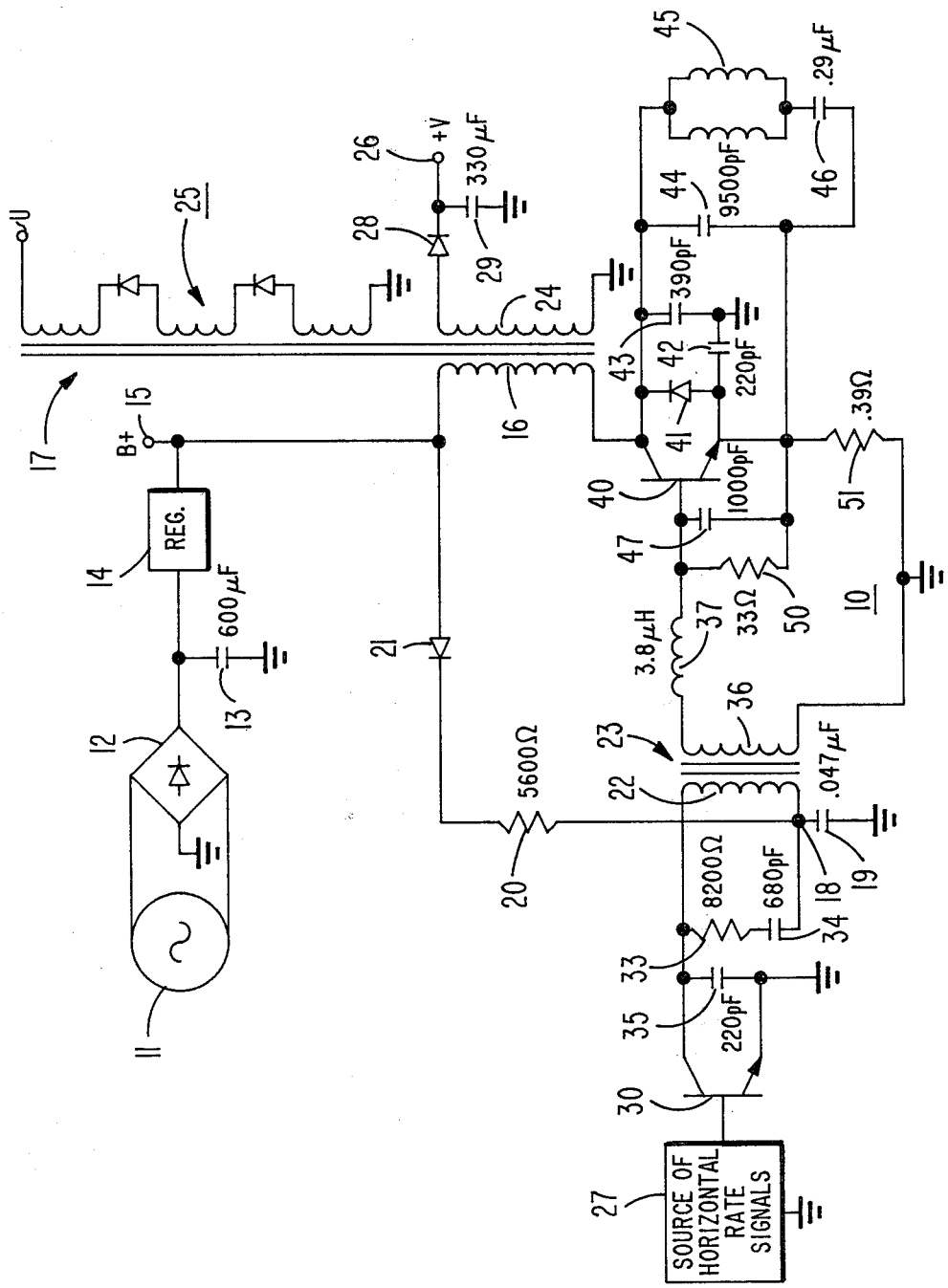

4,419,608

HORIZONTAL DEFLECTION CIRCUIT

This invention relates to television receiver horizontal deflection circuits which provide protection to the horizontal output transistor during receiver fault conditions.

BACKGROUND OF THE INVENTION

Transistorized horizontal deflection circuits may be made up of a horizontal switching or output transistor, a diode, one or more capacitors and a deflection winding. The output transistor, operating as a switch, is driven by a horizontal rate square wave signal and conducts during a portion of the horizontal trace interval. A diode, connected in parallel with the transistor, conducts during the remainder of the trace interval. A retrace capacitor and the deflection yoke winding are coupled in parallel across the transistor-diode combination. Energy is transferred into and out of the deflection winding via the diode and output transistor during the trace interval and via the retrace capacitor during the retrace interval.

In some television receivers, the collector of the horizontal output transistor is coupled to the B+ power supply through the primary windings of the high voltage transformer. Under certain conditions, the transistor may be subject to abnormally high collector currents, which may damage the transistor. For example, if arcing should occur within the kinescope, the high voltage winding of the high voltage transformer is effectively short-circuited to ground, which causes the impedance presented by the primary winding to appear very small. The collector current in the horizontal output transistor therefore increases greatly and may cause breakdown of the transistor.

The high voltage transformer primary winding is coupled to the regulated B+ power supply and provides power via the transformer secondary windings for receiver circuits such as vertical deflection, signal processing and audio during normal receiver operation. During receiver start up, before the B+ power supply can provide the regulated B+ voltage, the previously described circuits may heavily load the secondary windings of the high voltage transformer. Because of this, horizontal output transistor collector current and hence the transformer primary winding current will increase in an attempt to supply the transformer secondaries with sufficient power. The transistor collector current may then increase to such an extent that damage to the transistor may occur.

A resistor may be placed in the output transistor conduction path to limit transistor collector current, but as the transistor also conducts deflection yoke current, the added resistance, which may be of the same order of magnitude as the resistance of the horizontal deflection coil, may degrate the deflection waveform linearity, resulting in raster distortion.

SUMMARY OF THE INVENTION

The present invention provides means for protecting the horizontal output transistor under heavy loading conditions without adversely affecting the normal operation of the horizontal deflection circuit.

In accordance with the present invention, a television horizontal deflection circuit comprises a transistor having base, emitter, and collector electrodes. A source of horizontal rate drive signals is coupled to the base electrode of the transistor and to a source of reference potential. A source of high voltage representative signals is coupled to the collector electrode of the transistor, and a horizontal deflection coil is coupled to the collector electrode and the emitter electrode of the transistor. A resistor is coupled to the emitter electrode and to the source of reference potential.

BRIEF DESCRIPTION OF THE DRAWING

The sole FIGURE of the accompanying drawing illustrates a schematic and block diagram of a portion of a television receiver including a horizontal deflection circuit in accordance with the present invention.

DETAILED DESCRIPTION

Referring to the drawing, there is shown a portion of a television receiver including a horizontal deflection circuit 10 in accordance with the present invention. The receiver is powered from a power source 11, which represents, for example, an ac power line, which is coupled to a bridge rectifier circuit 12 for forming a pulsating direct current. The output of rectifier 12 is applied to a filter capacitor 13 for forming an unregulated B+ direct voltage which in turn is applied to a voltage regulator circuit 14. Voltage regulator 14 may be a conventional switching regulator, such as disclosed in U.S. Pat. No. 4,163,926, issued on Aug. 7, 1979, in the name of D. H. Willis and entitled "Switching Regulator for a Television Apparatus". Voltage regulator 14 produces regulated B+ direct voltage at a terminal 15. This B+ supply voltage is applied through a primary winding 16 of a high voltage transformer 17 to the deflection circuit 10, and through a resistor 20 and a diode 21 to a junction 18. Junction 18 is coupled to a primary winding 22 of a driver transformer 23, and through a filter capacitor 19 to ground.

High voltage transformer 17 may include a number of secondary windings, such as windings 24 and 25. Winding 24 may be energized to provide a source of voltage +V at a terminal 26 via a rectifying diode 28 and a filter capacitor 29. The +V voltage supply may be used to power other receiver circuits, such as audio or signal processing circuitry. Winding 25 comprises a plurality of windings separated by rectifying diodes which provide a stepped-up rectified anode or ultor high voltage at a terminal U. The high voltage at terminal U, of the order of 25 kv, is applied to the ultor terminal of the receiver kinescope (not shown).

Horizontal deflection circuit 10 comprises a source 27 of horizontal rate signals, such as a conventional horizontal switching oscillator. Signal source 27 is coupled to the base of a horizontal driver transistor 30. The collector of transistor 30 is coupled directly to primary winding 22 of driver transformer 23. The collector of transistor 30 is also coupled through a resistor 33 and a capacitor 34 to junction 18, and to the emitter of transistor 30 through a radio frequency interference suppression capacitor 35. The emitter of transistor 30 is grounded. Resistor 33 and capacitor 34 reduce current switching ringing caused by the inductance in primary winding 22.

One end of secondary winding 36 of driver transformer 23 is coupled through an inductor 37 to the base of a horizontal output transistor 40. The other end of winding 36 is grounded.

The collector of horizontal output transistor 40 is coupled to the previously described primary winding 16 of high voltage transformer 17. In parallel across the collector and emitter of transistor 40 is a damper diode 41, radio frequency interference (rfi) suppression capacitors 42 and 43, a retrace capacitor 44, and a horizontal deflection winding 45 in series with an "S-shaping" capacitor 46. The junction between capacitors 42 and 43 is grounded. The parallel combination of an rfi suppression capacitor 47 and an anti-ringing resistor 50 is coupled between the base and emitter of transistor 40. A resistor 51 is coupled between the emitter of transistor 40 and ground.

During normal receiver operation, horizontal rate signal source 27 applies a rectangular wave voltage to driver transistor 30, causing it to switch. During conduction of transistor 30, current flows through primary winding 22 of driver transformer 23, storing inductance energy in the winding.

While transistor 30 is conducting, a relatively small voltage is developed across secondary winding 36 of transformer 23. Output transistor 40 is therefore nonconducting. When transistor 30 is switched off, current flow is interrupted in primary winding 22. The voltage across secondary winding 36 rises rapidly, providing base drive to transistor 40 sufficient to saturate it. The voltage acoss the secondary winding 36 will decay, but sufficient base drive is provided to maintain transistor 40 in saturation during normal receiver operation until transistor 40 is turned off by action of the switching of transistor 30 in response to the signal from source 27. Inductor 37 provides for a smooth turn off of transistor 40.

During the first portion of the horizontal trace interval, transistor 30 is conducting and energy is being stored in winding 22 of transformer 23. Transistor 40 is nonconductive, and damper diode 41 is conducting providing a path for yoke winding 45 current to flow through S-shaping capacitor 46. Yoke current decays as capacitor 46 becomes charged. Near the center of trace, transistor 40 is turned on, yoke current flows in the opposite direction, and S-shaping capacitor 46 discharges to provide the desired S-correction. Near the end of trace, transistor 40 is turned off but yoke current continues to flow into retrace capacitor 44. Yoke winding 45 and capacitor 44 resonate for one half cycle, causing yoke current to reverse direction during the retrace interval in order to deflect the electron beams back to the other side of the screen to begin the next scan interval. The yoke current return path is back to the emitter of transistor 40 so that yoke current does not flow through resistor 51. This avoids scan linearity degradation.

As described collector current in transistor 40 may increase during certain receiver fault conditions, which tends to bring transistor 40 out of saturation. Nonsaturated conduction of transistor 40 results in large power dissipation by the transistor, which may damage it. One of these conditions may occur when high voltage arcing between kinescope internal components takes place. Kinescope arcing effectively shorts the high voltage transformer windings to ground. This causes the impedance of primary winding 16 to greatly decrease, such that the B+ supply provides large amounts of current to the collector of transistor 40 during its conduction interval, tending to bring transistor 40 out of saturation. Resistor 51, in the emitter-ground path of transistor 40, raises the emitter voltage of transistor 40 which increases the transistor base drive requirement, thereby providing negative feedback which attempts to turn transistor 40 off. Conduction of transistor 40 is therefore limited and power dissipation by the transistor is reduced.

Another situation in which transistor 40 collector current may increase occurs during receiver start-up. Circuits which are powered from secondary windings 24 via the +V supply may load down the supply beyond its capabilities during start-up, before the B+ supply is fully energized. Initial charging of capacitor 29 may also load windings 24. Loading on windings 24 also loads the primary winding 16, causing transistor 40 to conduct more current to make up the deficiency. Again, resistor 51 acts to control the conduction of transistor 40 via feedback to the drive circuit in order to limit the collector current to a safe level in order to prevent failure of transistor 40.

Resistor 51 is therefore uniquely located to provide current-limiting protection to horizontal output transistor 40 under high current fault conditions without degrading horizontal scan linearity. Resistor 51 also provides negative feedback to the output transistor in order to further protect the transistor by attempting to turn it off under the previously described high collector current conditions.

While the described embodiment illustrates the use of bipolar transistors, the principles described are equally valid for other active devices. For example, a field-effect transistor could be used for some applications, with the terms gate, source and drain being substituted for base, emitter and collector in the description.

I claim:

1. A television horizontal deflection circuit comprising:
    a transistor having base, emitter and collector electrodes;
    a source of horizontal rate drive signals coupled to said base electrode of said transistor and to a source of reference potential and providing base current to said transistor;
    a load circuit comprising variable impedance means providing load current to said collector electrode of said transistor;
    horizontal deflection coil means including distortion correcting impedance means coupled between said collector electrode and said emitter electrode of said transistor; and
    resistance means coupled to said emitter electrode of said transistor and to said source of reference potential, said resistance means coupled so as to be located in both the path of said load current and the path of said base current of said transistor to enable the voltage developed by the load current across said resistance means to bias the base-emitter junction of said transistor in accordance with said load current.

2. The arrangement defined in claim 1, wherein said resistance means is chosen to alter said base current in a manner so as not to significantly affect the saturated conduction of said transistor during normal operation of said deflection circuit while maintaining conduction of said transistor at reduced levels under heavy loading of said deflection circuit.

3. The arrangement defined in claim 1, wherein said horizontal deflection coil means including distortion correcting means is directly coupled between said collector electrode and said emitter electrode of said transistor in order to prevent deflection current from flowing in said resistance means.

4. A television horizontal deflection circuit comprising:
- drive circuit means comprising a source of horizontal rate signals, a transformer and a first transistor having an input electrode coupled to said signal source and having an output electrode coupled to a first winding of said transformer for generating a base drive voltage across a second winding thereof;
- output circuit means comprising a second transistor having an input electrode coupled to said transformer second winding, an output electrode coupled to one end of a deflection winding, and a reference electrode coupled to the other end of said deflection winding and to one terminal of a resistance means, the other terminal of said resistance means and said transformer second winding being coupled to a point of reference potential; and
- supply circuit means comprising a source of variable current coupled to said output electrode of said second transistor;
- whereby a variable current flows through a first current path comprising said variable current source, said second transistor and said resistance means, whereby upon application to the input electrode circuit of said second transistor of both said base drive voltage and the voltage developed in said resistance means by said variable current, a base current flows through a second current path comprising the input electrode-to-reference electrode path of said second transistor, said resistance means and said transformer second winding and whereby a third current flows through a third current path comprising said second transistor and said deflection winding, said third current path bypassing said resistance means.

5. A television horizontal deflection circuit, comprising:
- a voltage source;
- inductance means coupled to said voltage source for causing a time-varying first current to flow in said inductance means, the effective value of the impedance of said inductance means decreasing under certain conditions;
- transistor means including base, emitter and collector electrodes, said collector electrode being coupled to said voltage source through said inductance means for energizing said inductance means by said voltage source in order to cause said first current to flow in said inductance means, and for periodically interrupting said energization of said inductance means;
- retrace capacitance means coupled to said emitter and collector electrodes, whereby said periodic interrupting of said inductance means energization causes said first current to flow in said retrace capacitance means, thereby creating a high retrace voltage which reverses the direction of said first current, said decrease of said effective impedance causing said first current flowing through said transistor means to become large such that said transistor means may become damaged;
- resistance means coupled to said emitter electrode for limiting the current flow in said transistor means when said first current becomes large;
- a horizontal deflection winding;
- coupling means coupling one terminal of said horizontal deflection winding to said collector electrode for energizing said horizontal deflection winding in order to cause yoke current to flow through said winding, said winding also energized by said retrace voltage for periodically reversing said yoke current, said coupling means further coupling a second terminal of said deflection winding to said emitter electrode of said transistor means whereby said yoke current flows in said transistor means and not in said resistance means, in order to limit energy losses in said resistance means; and
- switch drive means coupled to said base electrode and to said resistance means for producing a drive voltage across the base-emitter junction of said transistor means, whereby the voltage across said resistance means caused by the flow of said first current therethrough opposes said drive voltage in order to cause a feedback effect which reduces drive to said transistor means when said first current becomes large.

6. The arrangement defined in claim 5, wherein said first current causes a voltage to be developed across said resistance means, said voltage causing said transistor means to remain in its saturated, low impedance state when said transistor means is conducting during normal operation, said voltage causing said transistor to enter a nonsaturated, high impedance state when said transistor is conducting when said first current becomes large.

* * * * *